United States Patent
Kumagai et al.

(10) Patent No.: US 11,131,932 B2
(45) Date of Patent: Sep. 28, 2021

(54) CLEANING LIQUID, AND METHOD OF CLEANING SUBSTRATE PROVIDED WITH METAL RESIST

(71) Applicant: TOKYO OHKA KOGYO CO., LTD., Kawasaki (JP)

(72) Inventors: Tomoya Kumagai, Kawasaki (JP); Takahiro Akiyoshi, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/837,753

(22) Filed: Apr. 1, 2020

(65) Prior Publication Data

US 2020/0326630 A1 Oct. 15, 2020

(30) Foreign Application Priority Data

Apr. 11, 2019 (JP) ............... JP2019-075725

(51) Int. Cl.
| | |
|---|---|
| *C11D 7/26* | (2006.01) |
| *G03F 7/42* | (2006.01) |
| *G03F 7/004* | (2006.01) |
| *C11D 11/00* | (2006.01) |
| *C11D 3/20* | (2006.01) |
| *H01L 21/02* | (2006.01) |

(52) U.S. Cl.
CPC ............ *G03F 7/425* (2013.01); *C11D 3/2072* (2013.01); *C11D 11/0047* (2013.01); *G03F 7/0042* (2013.01); *H01L 21/02087* (2013.01)

(58) Field of Classification Search
CPC ................................................ C11D 11/0047
USPC ....................................................... 510/175
See application file for complete search history.

(56) References Cited

U.S. PATENT DOCUMENTS

| | | | |
|---|---|---|---|
| 9,176,377 B2 | 11/2015 | Stowers et al. | |
| 2010/0248486 A1* | 9/2010 | Nakamura | G03F 7/426 438/706 |
| 2011/0132397 A1* | 6/2011 | Kumon | C11D 7/30 134/6 |
| 2011/0143547 A1* | 6/2011 | Nakamura | C11D 7/265 438/710 |
| 2013/0261039 A1* | 10/2013 | Little | C07C 215/40 510/175 |
| 2015/0155159 A1* | 6/2015 | Igarashi | H01L 21/02068 134/28 |
| 2016/0254140 A1* | 9/2016 | Saito | C11D 7/08 134/22.19 |

FOREIGN PATENT DOCUMENTS

WO    WO 2018/031896 A1    2/2018

\* cited by examiner

*Primary Examiner* — Gregory E Webb

(74) *Attorney, Agent, or Firm* — Knobbe Martens Olson & Bear LLP

(57) ABSTRACT

A cleaning liquid usable for cleaning a substrate provided with a metal resist, the cleaning liquid including a solvent, an organic acid, and a compound (A) represented by general formula (a-1) shown below (in the formula, $Ra^1$ and $Ra^2$ each independently represents an alkyl group having 1 to 3 carbon atoms).

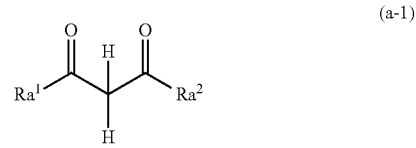

(a-1)

13 Claims, No Drawings

CLEANING LIQUID, AND METHOD OF CLEANING SUBSTRATE PROVIDED WITH METAL RESIST

TECHNICAL FIELD

The present invention relates to a cleaning liquid, and a method of cleaning a substrate provided with a metal resist.

Priority is claimed on Japanese Patent Application No. 2019-075725, filed Apr. 11, 2019, the entire content of which is incorporated herein by reference.

DESCRIPTION OF RELATED ART

The processing of semiconductor circuits and devices has involved the continued shrinkage of critical dimensions over each generation. As these dimensions shrink, new materials and methods are required to meet the demands of processing and patterning smaller features.

Patterning generally involves selective exposure of a thin layer of a radiation sensitive material (resist) to form a pattern that is then transferred into subsequent layers or functional materials. There has been proposed a metal resist suitable for providing good absorption for EUV (extreme ultraviolet light) and EB (electron beam) while providing very high etching contrast (for example, see Patent Literature 1).

In patterning using such a metal resist, a ligand coordinated to a metal peroxide in the metal resist is decomposed by exposure, hydrolysis and condensation proceed, a metal oxide is formed, and the resist becomes hardly soluble in a developer. Subsequently, by developing the resist, a pattern exhibiting a high etching resistance may be formed.

However, in patterning using a metal resist, when a metal resist is applied to a substrate, clusters of metal peroxide may be bonded to the surface of a substrate such as a silicon wafer, and residues may be generated.

In order to remove such residues, it has been proposed to use a cleaning liquid containing an organic solvent and a carboxylic acid (for example, see Patent Literature 2).

DOCUMENTS OF RELATED ART

Patent Literature

[Patent Literature 1] U.S. Pat. No. 9,176,377
[Patent Literature 2] WO2018/031896

SUMMARY OF THE INVENTION

However, a cleaning liquid containing an organic solvent and a carboxylic acid as described in Patent Literature 2 has room for improvement in metal removability.

The present invention takes the above circumstances into consideration, with an object of providing a cleaning liquid usable for cleaning a substrate provided with a metal resist which exhibits improved metal removability, and a method of cleaning a substrate provided with a metal resist.

For solving the above-mentioned problems, the present invention employs the following aspects.

A first aspect of the present invention is a cleaning liquid usable for cleaning a substrate provided with a metal resist, the cleaning liquid including a solvent, an organic acid, and a compound (A) represented by general formula (a-1) shown below.

[Chemical Formula 1]

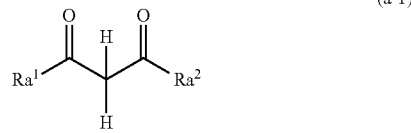

(a-1)

In the formula, $Ra^1$ and $Ra^2$ each independently represents an alkyl group having 1 to 3 carbon atoms.

A second aspect of the present invention is a method of cleaning a substrate provided with a metal resist, the method including: cleaning a substrate provided with a metal resist using the cleaning liquid of the first aspect.

According to the present invention, there are provided a cleaning liquid usable for cleaning a substrate provided with a metal resist which exhibits improved metal removability, and a method of cleaning a substrate provided with a metal resist.

DETAILED DESCRIPTION OF THE INVENTION (Cleaning Liquid)

The cleaning liquid according to the first aspect of the present invention includes a solvent, an organic acid, and a compound (A) represented by general formula (a-1). The cleaning liquid according to the present embodiment is used for cleaning a substrate provided with a metal resist.

<Solvent>

The solvent is not particularly limited, and examples thereof include water and an organic solvent.

Examples of the organic solvent include glycol ethers and esters thereof, such as propylene glycol methyl ether (PGME), propylene glycol methyl ethyl acetate (PGMEA), propylene glycol butyl ether (PGBE), and ethylene glycol methyl ether; alcohols, such as ethanol, propanol, isopropyl alcohol, and isobutyl alcohol, hexanol, ethylene glycol and propylene glycol; cyclic esters such as y-butyrolactone; esters such as n-butyl acetate and ethyl acetate; ketones such as 2-heptanone; liquid cyclic carbonates such as propylene carbonate and butylene carbonate; and cyclic sulfones such as sulfolane.

Among these examples, the solvent is preferably an organic solvent having no hydroxyl group, more preferably glycol ether or ester thereof or ketone, and still more preferably propylene glycol methyl ether (PGME), propylene glycol methyl ethyl acetate (PGMEA) or 2-heptanone, and most preferably, propylene glycol methyl ethyl acetate (PGMEA).

By using an organic solvent having no hydroxyl group as the solvent, it becomes easier to suppress the esterification reaction of the acid (formic acid) in the cleaning liquid, the temporal stability of the cleaning liquid may be reliably improved.

In the present embodiment, as the solvent, one kind of solvent may be used, or a mixed solvent containing two or more kinds of solvents may be used.

In the cleaning liquid of the present embodiment, the amount of the solvent with respect to the total mass of the cleaning liquid is preferably 30 to 89.9% by mass, more preferably 40 to 84.7% by mass, still more preferably 47.5 to 79.5% by mass, and most preferably 53 to 69.3% by mass.

<Organic Acid>

The organic acid is not particularly limited, and examples thereof include carboxylic acids such as formic acid, acetic acid, citric acid, oxalic acid, 2-nitrophenylacetic acid, 2-ethylhexanoic acid and dodecanoic acid; sugar acids such as ascorbic acid, tartaric acid and glucuronic acid; sulfonic acids such as benzenesulfonic acid and p-toluenesulfonic acid; phosphoric acid esters such as bis (2-ethylhexyl) phosphoric acid; and phosphoric acid.

Among these examples, as the organic acid, formic acid, acetic acid or oxalic acid is preferable, and formic acid is more preferable.

In the cleaning liquid of the present embodiment, the amount of the organic acid with respect to the total mass of the cleaning liquid is preferably 10 to 60% by mass, more preferably 15 to 55% by mass, still more preferably 20 to 50% by mass, and most preferably 30 to 45% by mass.

When the amount of the organic acid is within the above-mentioned preferable range, the metal removability of the cleaning liquid may be reliably improved.

<Compound (A)>

The compound (A) is represented by general formula (a-1) shown below, and functions as a chelating agent.

[Chemical Formula 2]

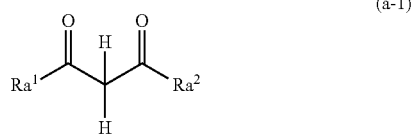

(a-1)

In the formula, $Ra^1$ and $Ra^2$ each independently represents an alkyl group having 1 to 3 carbon atoms.

In formula (a-1), examples of the alkyl group having 1 to 3 carbon atoms represented by $Ra^1$ and $Ra^2$ include a methyl group, an ethyl group, a propyl group and an isopropyl group.

In the cleaning liquid of the present embodiment, the amount of the compound (A) with respect to the total mass of the cleaning liquid is preferably 0.1 to 10% by mass, more preferably 0.3 to 5% by mass, still more preferably 0.5 to 2.5% by mass, and most preferably 0.7 to 2% by mass.

When the amount of the compound (A) is within the above-mentioned preferable range, the metal removability of the cleaning liquid may be reliably improved by the chelating effect of the compound (A).

<Other Components>

The cleaning liquid of the present embodiment may contain, in addition to the above components, other components as long as the effects of the present invention are not impaired.

Examples of the other component include an inorganic hydrofluoric acid, a tetraalkylammonium compound, and a surfactant.

Examples of the inorganic hydrofluoric acid include hexafluorosilicic acid, hexafluorophosphoric acid, and fluoroboric acid.

Examples of the tetraalkylammonium compound include tetramethylammonium fluoride, tetrabutylammonium fluoride, and tetrabutylammonium fluorosilicate.

Examples of the surfactant include a polyalkylene oxide alkyl phenyl ether surfactant, a polyalkylene oxide alkyl ether surfactant, a block polymer surfactant composed of polyethylene oxide and polypropylene oxide, a polyoxyalkylene distyrenated phenyl ether surfactant, polyalkylene tribenzyl phenyl ether surfactants, and acetylene polyalkylene oxide surfactants.

As the additive, one kind of additive may be used, or two or more kinds of additives may be used in combination.

In the cleaning liquid of the present embodiment, the amount of the additive with respect to the total mass of the cleaning liquid is preferably 0 to 10% by mass.

The pH of the cleaning liquid according to the present embodiment in a 20% aqueous solution is preferably 1.9 or less, more preferably 1.8 or less, and still more preferably 1.7 or less.

When the pH of the cleaning liquid in a 20% aqueous solution is within the above-mentioned preferable range, the metal removability of the cleaning liquid may be more reliably improved.

When the cleaning liquid according to the present embodiment does not substantially contain water, the pH may be measured after diluting with water to prepare a 20% aqueous solution.

Alternatively, when the cleaning liquid according to the present embodiment contains a small amount of water, a 20% aqueous solution may be prepared by adding and diluting a considerable amount of water, and the pH may be measured.

The pH may be measured using a commercially available pH meter.

<Substrate Provided with Metal Resist>

The cleaning liquid according to the present embodiment is used for cleaning a substrate provided with a metal resist.

The substrate is not particularly limited, and a conventionally known substrate may be used. Examples thereof include a substrate for an electronic component, and a substrate on which a predetermined wiring pattern is formed. Specific examples of the material of the substrate include metals such as silicon wafer, copper, chromium, iron and aluminum; and glass.

The metal resist is not particularly limited, and includes a resist containing at least one metal selected from the group consisting of Sn, Hf, Zr, In, Te, Sb, Ni, Co, Ti, W, Ta and Mo.

More specifically, a metal resist and a patterning method described in any of U.S. Pat. No. 9,176,377B2, US2013/0224652, U.S. Pat. No. 9,310,684, US2016/0116839, Jiang, Jing; Chakrabarty, Souvik; Yu, Mufei; et al., "Metal Oxide Nanoparticle Photoresists for EUV Patterning", Journal Of Photopolymer Science And Technology 27(5), 663-6662014, A Platinum-Fullerene Complex for Patterning Metal Containing Nanostructures, D. X. Yang, A. Frommhold, D. S. He, Z. Y. Li, R. E. Palmer, M. A. Lebedeva, T. W. Chamberlain, A. N. Khlobystov, A. P. G. Robinson, Proc SPIEAdvanced Lithography, 2014, US2009/0155546, U.S. Pat. No. 6,566,276 may be used.

Among these examples, a silicon wafer is preferable as the substrate, and a metal resist containing Sn is preferable.

The cleaning liquid according to the present embodiment described above contains the compound (A) which functions as a chelating agent.

Therefore, it is presumed that the cleaning liquid according to the present embodiment exhibits high metal removability as compared to a conventional cleaning liquid containing a solvent and an organic acid.

(Method of Cleaning Substrate Provided with Metal Resist)

A second aspect of the present invention is a method of cleaning a substrate provided with a metal resist, the method including: a step of cleaning a substrate provided with a metal resist using the cleaning liquid of the first aspect (hereafter, this step is sometimes referred to simply as "cleaning step").

The substrate and the metal resist are the same as defined for the substrate and the metal resist described above in relation to the cleaning liquid of the first embodiment.

In the present embodiment, the cleaning step is not particularly limited, and examples thereof include a known cleaning method in a semiconductor manufacturing process such as edge bead removal and back rinsing.

In the present embodiment, the step of cleaning a substrate provided with a metal resist preferably includes applying the cleaning liquid according to the first aspect along the periphery of the substrate to remove an edge bead on the substrate (hereinafter, this operation is sometimes referred to as "edge rinse").

The edge rinsing method is not particularly limited as long as it is a conventionally known process, and examples thereof include a method described in WO2018/031896.

The number of times of edge rinsing is not particularly limited, and may be performed 1 to 20 times. Further, two or more cleaning liquids may be applied during edge rinsing.

In the edge rinse, the cleaning liquid may be dripped in an amount of preferably 0.05 to 50 mL, more preferably 0.075 to 40 mL, and still more preferably 0.1 to 25 mL.

As another embodiment, in the edge rinse, the cleaning liquid may be sprayed at a flow rate of preferably 5 mL/min to 50 mL/min, more preferably for 1 second to 5 minutes, and still more preferably for 5 seconds to 2 minutes.

In order to evaluate metal removability by edge rinsing, it is possible to inspect for residual metal on the substrate. Suitable approaches that are commercially available for the evaluation of trace metals generally include inductively coupled plasma mass spectrometry (ICP-MS). For evaluation of the substrate surface, gas phase decomposition-ICP-MS (VPD-ICP-MS) may be used. By using this technique, residual metal may be determined per unit area of the wafer surface along the edge.

In the present embodiment, in the case where the metal resist is a Sn-based resist, the amount of residual Sn is preferably $100 \times 10^{10}$ atoms/cm$^2$ or less, more preferably $90 \times 10^{10}$ atoms/cm$^2$ or less, and still more preferably $80 \times 10^{10}$ atoms/cm$^2$ or less.

According to the method of cleaning a substrate provided with a metal resist according to the embodiment described above, since the substrate provided with a metal resist is cleaned using a cleaning liquid containing a solvent, an organic acid, and a compound (A), good metal removability may be exhibited.

EXAMPLES

As follows is a description of examples of the present invention, although the scope of the present invention is by no way limited by these examples.

<Preparation of Cleaning Liquid>

Example 1, Comparative Example 1

The components shown in Table 1 were mixed together to obtain each cleaning liquid.

TABLE 1

| | Solvent | Acid | Chelating agent | pH (20% aq.) | Amount of residual Sn [×10$^{10}$ atom/cm$^2$] |
|---|---|---|---|---|---|
| Comparative Example 1 | PGMEA [60] | Formic acid [40] | — | 1.66 | 102 |
| Example 1 | PGMEA [59] | Formic acid [40] | (A)-1 [1] | 1.67 | 32 |

In Table 1, the reference characters indicate the following. The values in brackets [ ] indicate the amount (in terms of parts by mass) of the component added. The pH is a value measured by diluting the cleaning liquid of each example with water to prepare a 20% aqueous solution.

PGMEA: Propylene glycol methyl ethyl acetate
(A)-1: Acetylacetone

<Evaluation of Sn Removability>

On a 6-inch Si wafer, 1.5 mL of an organometallic tin oxyhydroxide resist (manufactured by Impria) was applied, and a Sn resist film was formed by spin coating.

Next, 5 mL of the cleaning liquid of each example was applied to the Si wafer on which the Sn resist film was formed, and the wafer was rotated at 1,500 rpm for 45 seconds until the wafer was dried. After repeating this cleaning operation 5 times, 5 mL of a mixed solution of propylene glycol methyl ether (PGME) and propylene glycol methyl ethyl acetate (PGMEA) in a mass ratio of 50% was applied, and the wafer was dried at 1,500 rpm for 45 seconds until the wafer was dried.

Next, the amount of residual Sn ($\times 10^{10}$ atom/cm$^2$) was measured by ChemTrace (registered trademark) using gas phase decomposition-inductively coupled plasma-mass spectrometry (VPD-ICP-MS). The results are shown in Table 1.

From the results shown in Table 1, it was confirmed that the cleaning liquid of Example 1 had a smaller amount of residual Sn than the cleaning liquid of Comparative Example 1, and had good metal removability.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A metal resist cleaning liquid comprising:
a solvent,
an organic acid, and
a compound (A) represented by general formula (a-1) shown below:

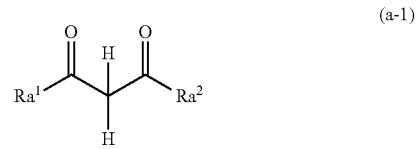

(a-1)

wherein Ra$^1$ and Ra$^2$ each independently represents an alkyl group having 1 to 3 carbon atoms wherein the amount of the compound (A) based on the total mass of the cleaning liquid is 0.1 to 10% by mass.

2. The metal resist cleaning liquid according to claim 1, wherein the solvent is an organic solvent having no hydroxy group.

3. The metal resist cleaning liquid according to claim 1, wherein the amount of the organic solvent based on the total mass of the cleaning liquid is 10 to 60% by mass.

4. The metal resist cleaning liquid according to claim 2, wherein the amount of the organic solvent based on the total mass of the cleaning liquid is 10 to 60% by mass.

5. A method of cleaning a substrate provided with a metal resist, the method comprising cleaning a substrate provided with a metal resist using the metal resist cleaning liquid of claim 1.

6. The method according to claim 5, which comprises applying the metal resist cleaning liquid of claim 1 along the periphery of the substrate to remove an edge bead on the substrate.

7. A metal resist cleaning liquid comprising:
a solvent,
an organic acid, and
a compound (A) represented by general formula (a-1) shown below:

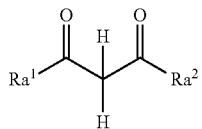

(a-1)

wherein Ra$^1$ and Ra$^2$ each independently represents an alkyl group having 1 to 3 carbon atoms, wherein the amount of the organic solvent based on the total mass of the cleaning liquid is 10 to 60% by mass.

8. The metal resist cleaning liquid according to claim 7, wherein the solvent is an organic solvent having no hydroxy group.

9. A method of cleaning a substrate provided with a metal resist, the method comprising:
cleaning a substrate provided with a metal resist using the metal resist cleaning liquid of claim 7.

10. The method according to claim 9, comprising applying the metal resist cleaning liquid along the periphery of the substrate to remove an edge bead on the substrate.

11. A method of cleaning a substrate provided with a metal resist, the method comprising:
cleaning the substrate using a metal resist cleaning liquid comprising a solvent, an organic acid, and a compound (A) represented by general formula (a-1) shown below:

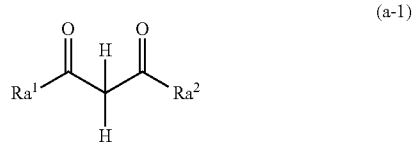

(a-1)

wherein Ra$^1$ and Ra$^2$ each independently represents an alkyl group having 1 to 3 carbon atoms, thereby removing the resist from the substrate; the metal resist comprising at least one kind of metal selected from the group consisting of: Sn, Hf, Zr, In, Te, Sb, Ni, Co, Ti, W, Ta, and Mo.

12. The method according to claim 11, which comprises applying the metal resist cleaning liquid along the periphery of the substrate to remove an edge bead on the substrate.

13. The method according to claim 11, wherein the metal resist comprises Sn.

* * * * *